United States Patent
Marion

(10) Patent No.: US 7,509,733 B2
(45) Date of Patent: Mar. 31, 2009

(54) METHOD FOR PRODUCING MEANS OF CONNECTING AND/OR SOLDERING A COMPONENT

(75) Inventor: Francçis Marion, Saint Martin le Vinoux (FR)

(73) Assignee: Commissariat A l'Energie Atomique, Paris (FR)

( * ) Notice: Subject to any disclaimer, the term of this patent is extended or adjusted under 35 U.S.C. 154(b) by 87 days.

(21) Appl. No.: 11/503,856

(22) Filed: Aug. 14, 2006

(65) Prior Publication Data
US 2007/0049065 A1    Mar. 1, 2007

(30) Foreign Application Priority Data
Aug. 30, 2005    (FR) .................................. 05 52611

(51) Int. Cl.
*H05K 3/02*    (2006.01)
*H01L 21/44*    (2006.01)

(52) U.S. Cl. ............................. 29/846; 29/848; 438/613
(58) Field of Classification Search .................. 29/846, 29/848; 438/613
See application file for complete search history.

(56) References Cited

U.S. PATENT DOCUMENTS

| | | | | |
|---|---|---|---|---|
| 2,757,443 | A | * | 8/1956 | Oshry et al. .................. 29/848 |
| 2,955,351 | A | * | 10/1960 | McCreadie .................. 29/848 |
| 5,547,902 | A | * | 8/1996 | Rohner ....................... 438/613 |
| 6,238,951 | B1 | | 5/2001 | Caillat |

* cited by examiner

Primary Examiner—C. J Arbes
(74) Attorney, Agent, or Firm—Burr & Brown

(57) ABSTRACT

A method for producing a plurality of stamped shapes to serve as a mechanism for connecting and/or soldering or sealing a component, on a substrate, including the steps of depositing a layer made of a ductile material on the substrate and stamping the layer by means of an etched die having the plurality of etched portions defining one or more shapes to form the plurality of stamped shapes.

9 Claims, 3 Drawing Sheets

METHOD FOR PRODUCING MEANS OF CONNECTING AND/OR SOLDERING A COMPONENT

SUMMARY OF THE INVENTION

The present invention relates to the field of microelectronics, more specifically to the field of hybridization and soldering or sealing techniques using fusible solder materials.

DESCRIPTION OF THE PRIOR ART

Developments in integrated-circuit technology have made it possible to achieve a high degree of miniaturization and, in particular, the fabrication of microcomponents.

Hybridizing chips on multilayer substrates in order to obtain interconnections between chips by means of conducting solder bumps is one of the technical achievements that has made such miniaturization possible. This technology, better known as "flip-chip" technology, makes it possible to hybridize hundreds of chips on ceramic substrates.

It uses conducting microbumps that are generally made of a material that has a low melting point, such as SnPb, In or AgCuSn, and this technology has now been largely mastered.

In the same field, but in a different application, a number of these microcomponents are encapsulated inside a package or protective cover or equivalent type structure, thus making it possible to ensure protection again shock, corrosion, stray electromagnetic radiation, etc.

In addition, such protective packages or covers also make it possible for such microcomponents to operate in a vacuum or in a controlled atmosphere (pressure, inert gas, etc.) or after leaktight sealing from their ambient atmosphere.

Such a package or cover is classically sealed by means of a joint or sealing seam applied around the periphery of the component in question, generally on a wettable area or surface which is also referred to as an adhesion surface.

More frequently, fabrication of the components in question, regardless whether they are microsensors, microactuators, micro-electro-mechanical systems (MEMS), etc., therefore requires the use of solder and/or connection elements having different heights measured in relation to a coordinate system consisting of the upper surface of the substrate on which the microcomponents in question are placed or mounted.

There are currently several known technologies that make it possible to produce such solder seams or deposit bumps or microbumps for hybridising and therefore connecting.

The following techniques deserve mention:

evaporation through a mask and soldering;

"solder jetting", a jet of droplets of solder similar to the droplets of ink used in inkjet printers;

electrolysis;

screen printing.

However, all these techniques always involve at least two operations in order to obtain solder and connection elements having different heights.

In addition, most of these technologies are expensive to implement, in particular because of the manipulations that they require.

The object of the present invention is precisely to dispense with the use of two consecutive stages in order to produce solder elements of different heights and, consequently, to reduce fabrication costs.

SUMMARY OF THE INVENTION

The present invention refers to a method for producing means of connecting and/or soldering or sealing a component on a substrate.

This method involves:

depositing on the substrate a layer of ductile material which, if applicable, conducts electricity;

stamping the layer thus produced by means of an etched die, the etching depending on the shape that one wishes to give the means of connecting and/or soldering.

In other words, the invention involves, during the fabrication process, carrying out no more and no less than one process to mould a material that is sufficiently ductile to enable it to deform, especially at ambient temperature, in similar fashion to widely-known technologies used to mint coins, or doing so at a temperature that is close to the melting temperature of said material or even a temperature above the latter.

In fact, it is necessary to give the stamping or punching die the desired shapes, especially the various depths desired, in order to obtain differing heights of the means of soldering or connecting.

Obviously, the height of the layer of ductile material previously deposited is adequate to allow correct stamping by the die and, consequently, the realization of different materials heights.

According to one aspect of the invention, the layer of ductile material is deposited on the wettable surfaces or areas previously produced on the substrate that accommodates the component or microcomponent. These wettable areas or surfaces are typically made of gold after producing a barrier layer that is typically made of nickel.

According to a first embodiment of the invention, these wettable areas or surfaces are precisely made depending on the desired profile of the means of soldering or connecting, i.e. they occupy a surface on the corresponding substrate that substantially matches the surface occupied on the same substrate by the connection and/or solder elements produced by the method according to the invention.

According to another embodiment of the invention, these wettable areas or surfaces cover the entire substrate and the layer intended to constitute these wettable surfaces is removed from the substrate between those areas accommodating the ductile material by etching after depositing said layer of ductile material, the latter acting as a mask during the operation to etch the layer that constitutes the wettable surfaces.

Finally and according to the invention, the ductile material is given a shape, after formatting or punching, that corresponds to the desired shape by remelting at a temperature in excess of the melting temperature of the ductile material.

Adopting this approach, in particular, produces a bump shape or if one wishes to have a sealing seam one gives the layer of ductile material thus deposited an overall cylindrical shape.

BRIEF DESCRIPTION OF THE DRAWINGS

The way in which the invention is implemented and its resulting advantages will be made more readily understandable by the descriptions of the following embodiments, given merely by way of example, reference being made to the accompanying drawings.

DESCRIPTION OF THE PREFERRED EMBODIMENTS

FIGS. 1a to 1d schematically illustrate the method in accordance with the invention.

According to this principle, the substrate 1 is typically made of silicon. This substrate consists, for example, of a wafer measuring 300 mm for instance.

One then deposits or transfers a layer of solder material 2 onto the wafer. This material is ductile and typically consists of indium or a tin-lead alloy or an AgCuSn alloy.

Figure 1A:
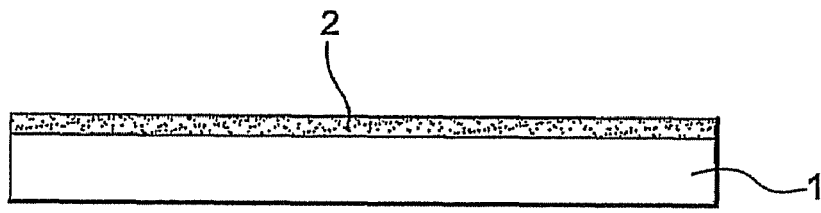
FIGS. 1a to 1d are schematic views of the principle used by the present invention.
Figure 1B:
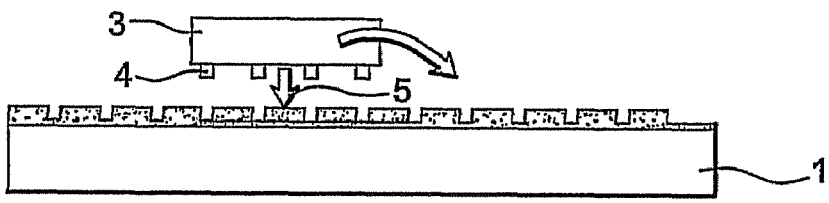
Figure 1C:
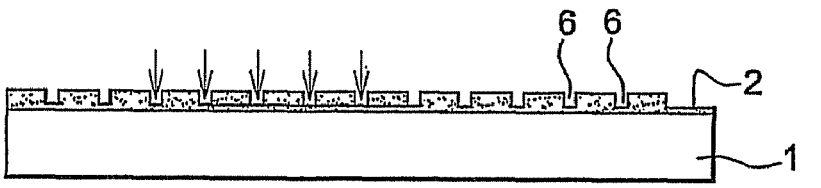
Figure 1D:
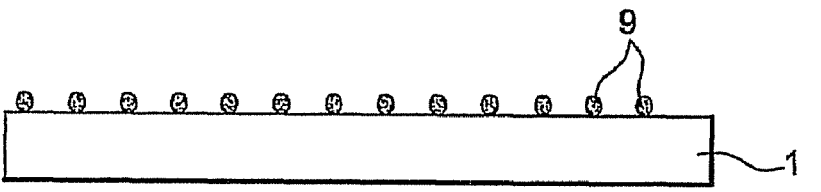
Figure 2:
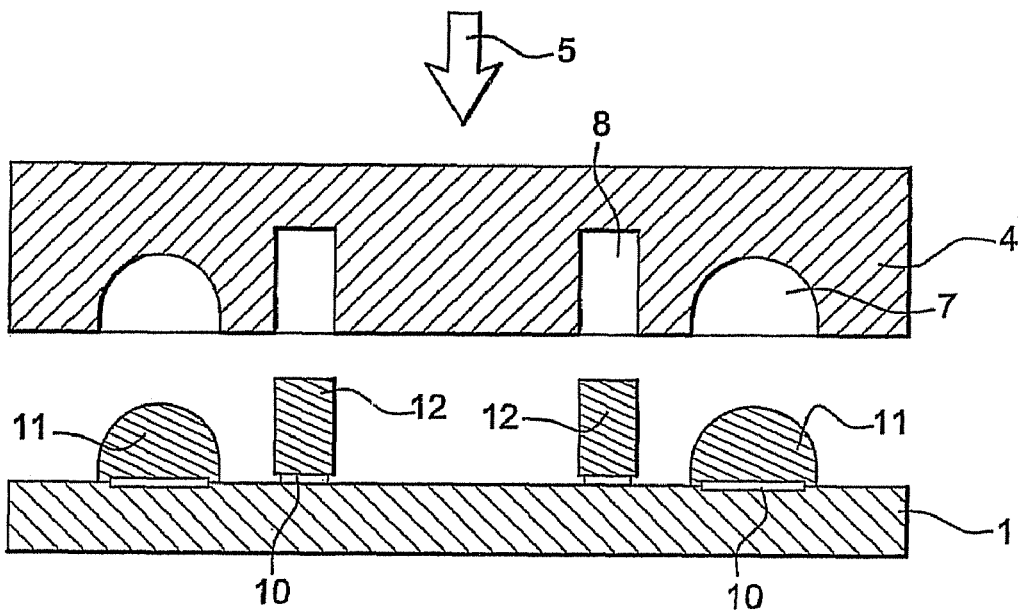
FIG. 2 is a schematic cross-sectional view intended to illustrate the process of stamping the ductile material according to a first embodiment.
Figure 3A:
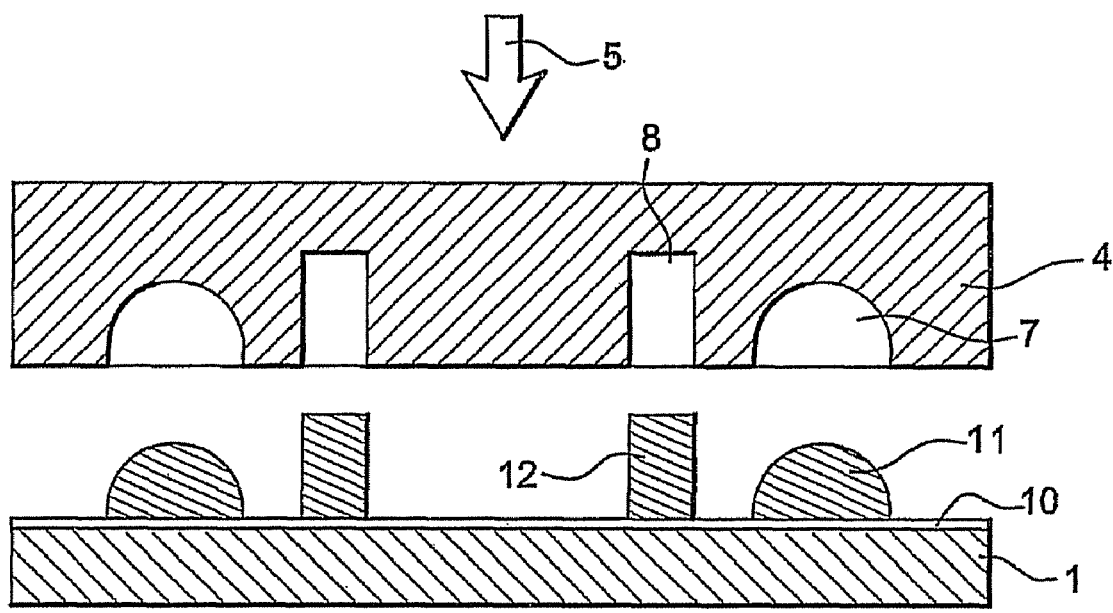
FIGS. 3a and 3b are views similar to FIG. 2, but of another embodiment.

A stamping process is then performed (FIG. 1b) by means of a die 3 with punches 4 or having shapes 7, 8 made in it that together define punches 4 (see FIG. 2 and FIG. 3a).

This die operates on the step-and-repeat principle: in this case the die is the same size as one photo composition field; it is applied to each field and the step-and-repeat process is based on the field pitch.

However, this die can also operate on an entire wafer in a global fashion: the die is then the same size as the wafer 1 and the stamping operation is performed in a single pass.

The die 3 is actuated by an automatic or manual press so that it stamps said layer of ductile material 2 in the direction shown by arrow 5.

To achieve this, the lower wall of shapes 7, 8 and the lower surface of the die are coated with a non-stick coating made of polytetrafluoroethylene (PTFE) for example and said die is then applied to the surface of the layer of ductile material 2 that is to be stamped with a pressure P 4. The die is then backed off, thus defining a succession of shapes depending on shapes 7 and 8 of said die.

This die is advantageously made of silicon. In fact, it has been found that using such a material makes it possible to achieve extremely fine patterns thereby making it possible to produce moulds using conventional photolithography and chemical etching at low cost and, in particular, makes it possible to produce patterns that have a natural trapezoidal shape, thereby encouraging stripping.

After stripping, some recessed areas are likely to contain solder residues that are removed by etching.

Finally (FIG. 1d), the bumps are formed using the conventional technique of remelting solder elements, i.e. by increasing the temperature to a temperature in excess of the melting temperature of said ductile material.

The bump shape is produced thanks to the natural phenomenon of decrease in surface tension and if a solder seam is used, remelting produces a substantially circular cross-section.

Nevertheless, most of the time the solder elements, whether they are sealing seams or conductive sealing bumps or microbumps, are transferred onto a wettable surface or area.

To achieve this, prior to depositing the layer of solder 2, a barrier layer of nickel is produced, especially using an electroless method, on the open pads following foundry operations that result in the production of the silicon CMOS wafer.

A layer of gold (gold acting as the adhesion metal and hence wettable surface) is transferred onto this nickel barrier layer using known processes such as that developed, for instance, by the company PACTECH.

According to the invention, there are two possible alternatives. The first alternative is to produce this double nickel/gold layer only in those locations where solder elements are ultimately located, regardless whether these are seams or microbumps (FIG. 2).

In this case, the wettable areas are pre-etched and the operation to deposit and format or punch the layer of ductile material 2 intended to constitute solder or connection elements takes place as defined above.

Figure 3B:
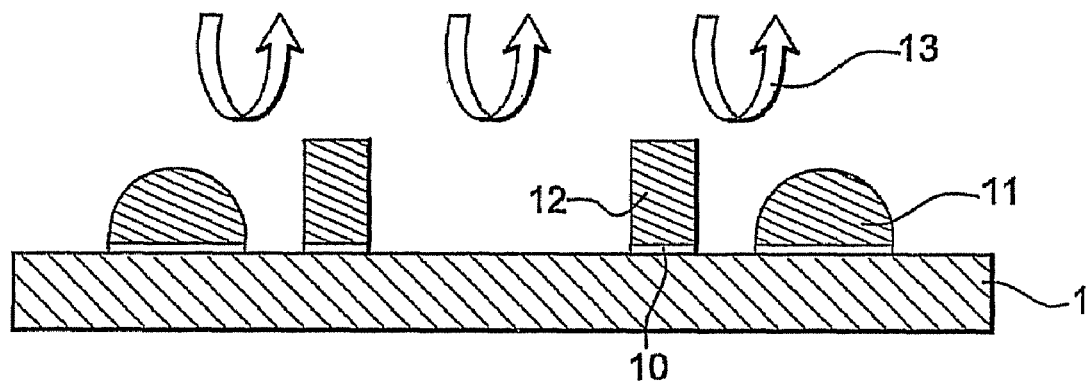
Figure 4A:
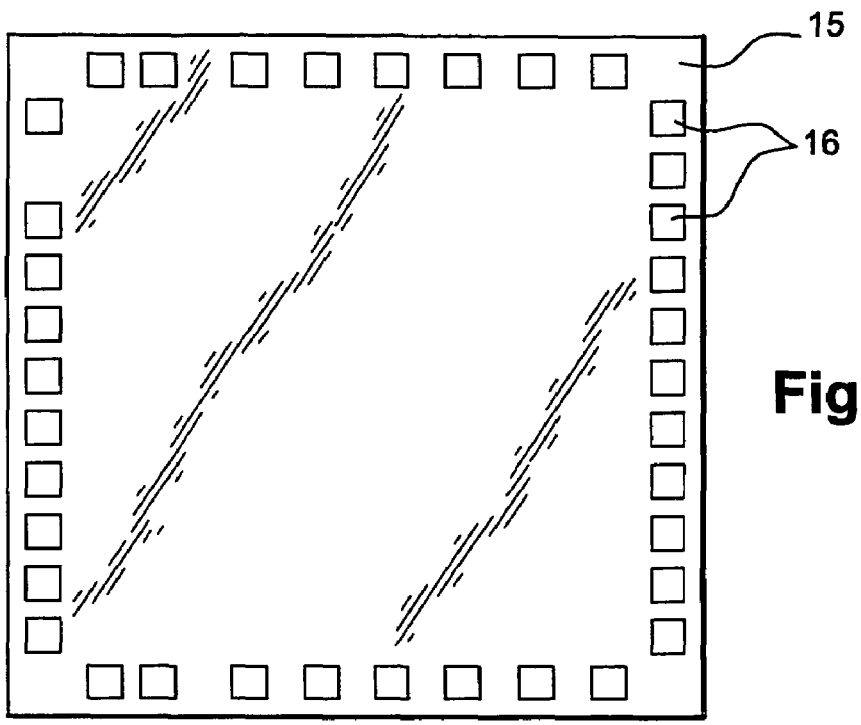
FIGS. 4a to 4e are, respectively, a schematic top view (FIG. 4a) and cross-sectional views (FIGS. 4b to 4d) of use of the method according to the invention in order to make bumps on a CMOS wafer.
Figure 4B:
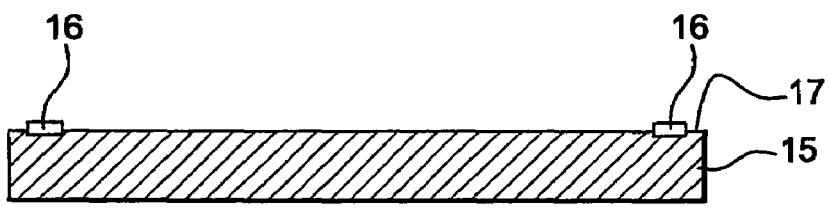
Figure 4C:
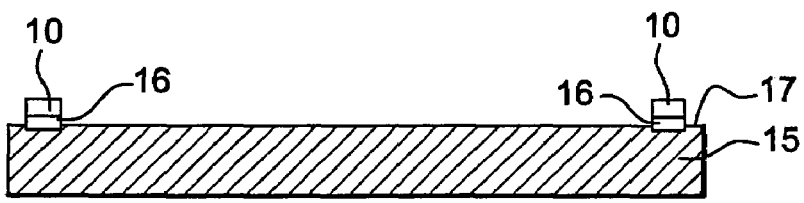
Figure 4D:
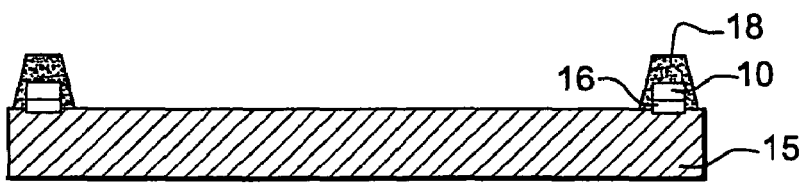
Figure 4E:
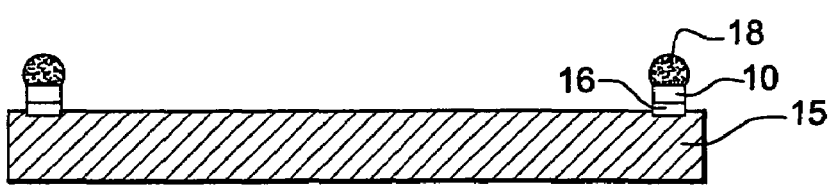

In another embodiment shown in FIGS. 3a and 3b, the entire upper surface of the wafer, except the surface intended to accommodate the component or microcomponent obviously, is coated in the nickel/gold layer 10. In this case, after the layer of ductile material 2 has been stamped to obtain the desired shape, the double barrier layer of nickel/gold is removed from areas that do not have solder elements by etching.

In both cases, it is possible that there will still be a film of ductile material between the shapes produced after stamping. An etching process must then be performed in order to remove this residue. To achieve this, the entire surface is refreshed by etching a fine layer of ductile material, both on the shapes and between the shapes.

In the second embodiment, this etching is followed by a second etching that removes the barrier layer between the shapes.

A more precise embodiment of the invention will now be described, reference being made to FIG. 4. This embodiment uses a CMOS wafer 15 from the silicon foundry measuring 300 mm by 300 mm. This has a certain number of conductive aluminium pads 16 that are spaced 100 µm apart and distributed around the periphery of the wafer. The surface area of the chip is 1 cm$^2$ and the height of the pads is 50 µm.

Thus, for a chip having a side length of 1 cm (surface area=$10^8$ µm$^2$), one deposits an 1.8 µm thick layer of indium. This gives a volume of ductile material equal to $1.8 \cdot 10^8$ µm$^3$. This chip is then stamped by a die etched to obtain 1000 pads measuring 60×60 µm. The solder practically covers the pads completely, the latter have a height of approximately 50 µm.

The real attractiveness of the method according to the invention is readily apparent to the extent that, in a single operation, it makes it possible to obtain solder elements of different size, something which was previously not possible. In addition, the techniques used, especially direct punching, but also electrolytic evaporation, make it possible to keep the cost price of such components down.

This being so, it is feasible to fabricate active microcomponents, especially electronic components, using this method, especially arrays for detecting electromagnetic radiation and, more especially, infrared radiation, regardless whether or not they incorporate compensation for the expansion that is inherent in changes in operating temperature.

It is also possible to produce sealing seams concomitantly with connection bumps for hermetic seals, especially to use a protective cover or packaging in order to hermetically seal the component.

Finally, the invention is also applicable to the preparation of hybridization bumps and, generally speaking, to producing all hybridized components regardless whether they are components that operate in the optical or x-ray spectrum or to hybridization on flexible tape, on ceramics, on a multi-chip module or on a board: "chip on board" (COB) (printed circuit) or on glass "chip on glass" (COG).

The invention claimed is:

1. A method for producing a plurality of stamped shapes on a substrate, said method comprising the steps of:
    forming an adhesion surface on an uninterrupted planar surface of said substrate;
    depositing a layer made of a ductile material on said adhesion surface; and
    stamping said ductile material layer on said surface of said substrate with a die having etched portions defining one or more shapes to form said plurality of stamped shapes extending above said surface of said substrate.

2. The method as claimed in claim 1, further comprising a step of removing residual material in recesses defined between said stamped shapes by etching.

3. The method as claimed in claim 1, wherein depths of different ones of said etched portions of said die are identical with respect to one another.

4. The method as claimed in claim 1, wherein said adhesion surface comprises gold formed on a nickel barrier layer.

5. The method as claimed in claim 1, further comprising a step of heating said stamped shapes to a temperature exceeding a melting temperature of said ductile material to melt and reform said stamped shapes.

6. The method as claimed in claim 1, wherein depths of different ones of said etched portions of said die are different with respect to one another.

7. The method as claimed in claim 1, wherein said adhesion surface is formed to define a plurality of discrete adhesion surface portions corresponding to predetermined locations on said surface of said substrate where said stamped shapes are to be formed.

8. The method as claimed in claim 1, wherein said adhesion surface is formed to entirely cover said surface of said substrate, so that after said stamping step, said stamped shapes comprise a mask defining exposed portions of said adhesion surface on said surface of said substrate, and wherein said method further comprises a step of removing said exposed portions of said adhesion surface by etching.

9. The method as claimed in claim 1, wherein said ductile material is conductive.

* * * * *